United States Patent
Poechmueller et al.

(10) Patent No.: US 6,711,648 B1
(45) Date of Patent: Mar. 23, 2004

(54) METHODS AND APPARATUS FOR INCREASING DATA BANDWIDTH IN A DYNAMIC MEMORY DEVICE BY GENERATING A DELAYED ADDRESS TRANSITION DETECTION SIGNAL IN RESPONSE TO A COLUMN ADDRESS STROBE SIGNAL

(75) Inventors: Peter Poechmueller, Burlington, VT (US); Yohji Watanabe, Kanagawa (JP)

(73) Assignee: Siemens Aktiengesellschaft Kabushiki Kaisha Toshiba, Munich (DE)

( * ) Notice: Subject to any disclaimer, the term of this patent is extended or adjusted under 35 U.S.C. 154(b) by 1243 days.

(21) Appl. No.: 08/825,311

(22) Filed: Mar. 28, 1997

(51) Int. Cl.[7] .............................................. G06F 12/00
(52) U.S. Cl. ..................... 711/105; 711/169; 365/233.5
(58) Field of Search .............................. 365/233.5, 233; 711/169, 105

(56) References Cited

U.S. PATENT DOCUMENTS

| | | | |
|---|---|---|---|
| 4,567,579 A | | 1/1986 | Patel et al. .................. 365/189 |
| 4,685,089 A | | 8/1987 | Patel et al. .................. 365/233 |
| 5,289,413 A | * | 2/1994 | Tsuchida et al. ......... 365/189.02 |
| 5,305,283 A | * | 4/1994 | Shimokura et al. ....... 365/233.5 |
| 5,341,341 A | | 8/1994 | Fukuzo ........................ 365/233 |
| 5,349,566 A | * | 9/1994 | Merritt et al. ............. 365/233.5 |
| 5,488,580 A | | 1/1996 | Park ....................... 365/189.05 |
| 5,490,114 A | | 2/1996 | Butler et al. ........... 365/189.05 |
| 5,587,964 A | | 12/1996 | Rosich et al. ............. 365/238.5 |
| 5,610,864 A | * | 3/1997 | Manning .................... 365/233 |
| 5,640,364 A | * | 6/1997 | Merritt et al. ............ 365/233.5 |
| 5,661,695 A | * | 8/1997 | Zagar et al. .............. 365/233.5 |
| 5,682,354 A | * | 10/1997 | Manning .................. 365/233.5 |
| 5,696,732 A | * | 12/1997 | Zagar et al. .............. 365/233.5 |
| 5,715,208 A | * | 2/1998 | Casper et al. ............. 365/233.5 |
| 5,717,654 A | * | 2/1998 | Manning .................. 365/233.5 |
| 5,729,503 A | * | 3/1998 | Manning .................. 365/233.5 |
| 5,751,656 A | * | 5/1998 | Schaefer ................... 365/233.5 |
| 5,802,010 A | * | 9/1998 | Zagar et al. .............. 365/233.5 |
| 5,812,488 A | * | 9/1998 | Zagar et al. .............. 365/233.5 |

* cited by examiner

Primary Examiner—Matthew Kim
Assistant Examiner—Woo Choi
(74) Attorney, Agent, or Firm—F. Chau & Associates, LLC (57) ABSTRACT

The present invention includes a cost efficient method of substantially increasing the data bandwidth of a dynamic random access memory (DRAM) device initially configured to operate in an extended data output (EDO) mode, the EDO DRAM device including at least one storage cell, a column decoder, an internal read/write data bus and an off chip driver latch, the column decoder decoding a column address upon receipt thereof such that data stored in the at least one storage cell corresponding to the decoded column addresses is placed on the internal read/write data bus in response to the receipt of an address transition detection (ATD) pulse generated by the dynamic memory device and further wherein output data is stored in the off chip driver latch in response to a transfer pulse. The method includes the steps of temporarily suppressing the generation of the ATD pulse such that data selected from the at least one storage cell is not placed on internal read/write data bus until after a delayed generation of the ATD pulse in response to the falling edge of a column address strobe (CAS) signal, such that a first pipeline stage is thereby substantially defined.

11 Claims, 7 Drawing Sheets

Figure 1: Typical hyper page mode operation of DRAM (EDO) (PRIOR ART)

Figure 2: Typical PNM operation (PRIOR ART)

Figure 3: ATD generated by CAS to release column access

Figure 4: Transfer signal TRF saves read data into pipe stage

Figure 5: Basic PNM operation. TRF transfers data into DQ-latch before it will be destroyed on internal read/write data bus Figure 6A
PRIOR ART

METHODS AND APPARATUS FOR INCREASING DATA BANDWIDTH IN A DYNAMIC MEMORY DEVICE BY GENERATING A DELAYED ADDRESS TRANSITION DETECTION SIGNAL IN RESPONSE TO A COLUMN ADDRESS STROBE SIGNAL

BACKGROUND OF THE INVENTION

1. Field of the Invention

The present invention relates to cost efficient methods and apparatus for increasing the data bandwidth associated with dynamic memory devices and, more particularly, to methods and apparatus for increasing the data bandwidth associated with memory devices, such as dynamic random access memory (DRAM) devices, to achieve pipelined nibble mode (PNM) operation. Such methods and apparatus may also find application in the realization of synchronous dynamic random access memory (SDRAM) or other memory devices.

2. Description of the Prior Art

It is generally known that a goal in the design of memory devices, such as DRAMs and SDRAMs, as well as related control circuitry, is to provide increased memory throughput, i.e., increased data bandwidth. It is also generally known that such an increase in data bandwidth may be substantially achieved by parallelizing memory access cycles through the implementation of concurrently operating pipeline stages. However, in the past, this was only possible with considerable costs due to additional control logic/registers resulting in larger chip sizes.

In DRAM device technology, modes of operation such as hyper-page and EDO (extended data out) have been implemented in an attempt to optimize memory access cycles and thereby increase data bandwidth. Hyper-page and EDO modes of operation are essentially the same in concept and characterized by a single row address being decoded to activate a common row referred to as a "page." Activation of a page enables memory location therein to be randomly accessed (read from or written to) individually by decoding varying column addresses corresponding thereto.

Figure 1:
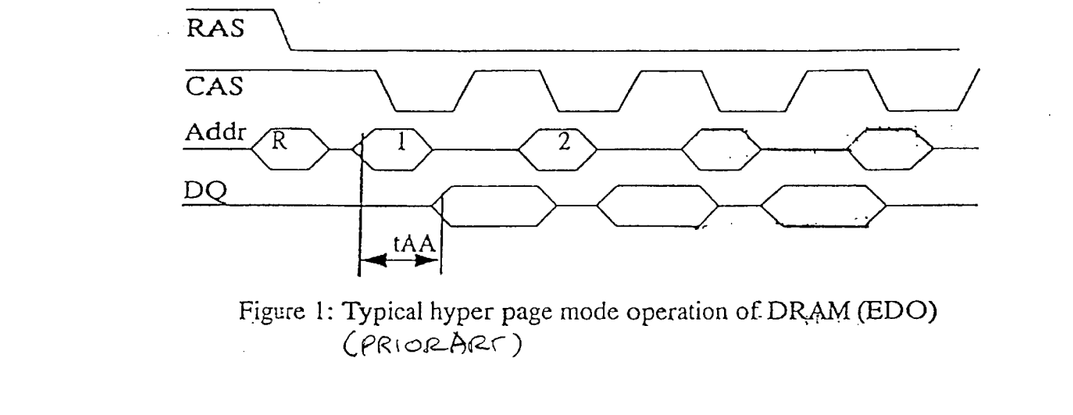
FIG. 1 is a timing diagram illustrating hyper-page mode (EDO mode) operation.

Referring initially to FIG. 1, a timing diagram illustrates an example of EDO mode operation. Particularly, upon the transition of a row address strobe (RAS) signal from a high logic level (e.g., +3.3) to a low logic level (e.g., 0V), a single row address is decoded thereby activating said row (page). Next, upon the transition of a column address strobe (CAS) signal from a high logic level to a low logic level, the first column address is decoded and the data corresponding to that column address in the particular activated row (page) is read from the memory location and placed on the external data input/output (DQ) lines of the DRAM device.

If a write operation is being performed, then the selected memory location is provided with data present on the DQ lines of the memory device. Nonetheless, the next column access is received (i.e., next transition of CAS from a high logic level to a low logic level) and the next memory location is accessed in that particular row (page). Data is then either read from or written to the selected memory location in a similar manner as explained above. Such a memory access procedure continues for each occurrence of a new column address (i.e., low logic level CAS).

A time interval $t_{AA}$ is shown in FIG. 1 and is defined as the time interval measured from the beginning of a column address transition to the time when data is available to be externally read on the DQ lines. This time interval $t_{AA}$ is critical in such operational modes because, as shown in FIG. 1, the data must be available to be read by the end of this time interval or else the next column access will occur thereby destroying the data from the previous column access. A major difference between fast-page and hyper-page mode (EDO) operations is that in the former, the data associated with a previous column access is destroyed when CAS transitions to a high logic level while, in the latter, the data from the previous cycle is not destroyed until CAS begins to transition again from a high logic level to a low logic level. Nonetheless, it is to be appreciated that the time interval $t_{AA}$ is the time parameter which limits the ability to increase the frequency of CAS occurrences (i.e., CAS frequency) and, therefore, limits the data bandwidth realizable in these particular modes of operation.

More recently, an alternative mode of operation has been developed which is known as pipelined nibble mode (referred hereinafter as PNM). PNM operation, also referred to as burst EDO, is a mode of operation which involves pipelined read access of a particular DRAM device. The major difference between fast-page mode or hyper-page mode and PNM is that in the former, data is available on the DQ lines (or retrievable from the DQ lines) before the next column access (i.e., before the occurrence of the next CAS transition to a low logic level) while in PNM or burst EDO mode, there exists a latency period which dictates that data is not provided to be read externally (from the DQ lines) until some time after the second low logic level CAS, e.g., before the third CAS low occurrence. Such a CAS latency allows for pipelining and, thus, much higher CAS frequencies (i.e., greater than approximately 100 Megahertz).

Figure 2:
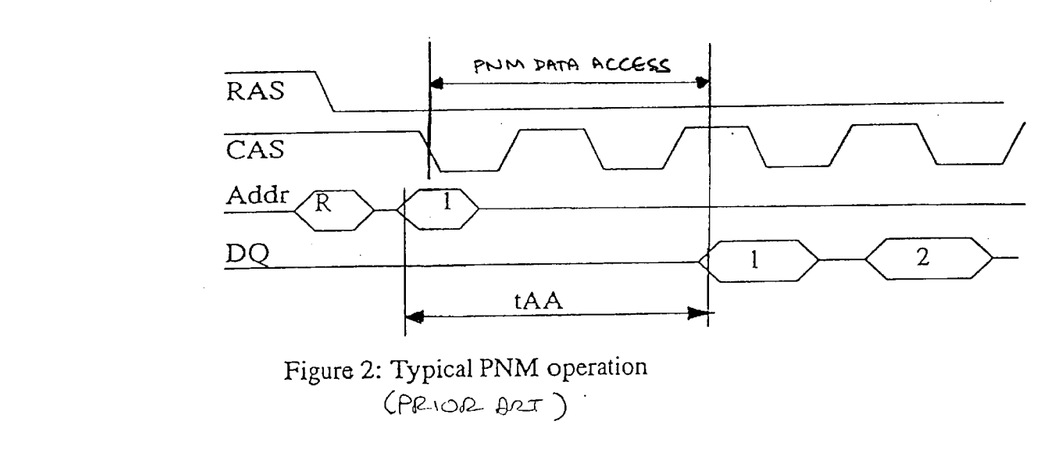
FIG. 2 is a timing diagram illustrating pipelined nibble mode operation.

Referring to FIG. 2, a timing diagram illustrates an example of PNM operation. Particularly, similar to EDO mode operation, a single row address is decoded thereby activating that row of memory locations upon the transition of RAS from a high logic level to a low logic level. Next a first column address is presented and decoded in accordance with the first occurrence of a low logic level transition of CAS; however, unlike EDO mode, the data is not placed on the external DQ lines until the second CAS occurrence. Further, as shown in FIG. 2, the data is not destroyed on (i.e., lost from) the DQ lines until the third transition of CAS to a low logic level and, thereafter, data is continuously provided for a fixed number of CAC cycles (i.e., burst of several data words). While a burst of only two data words is depicted in FIG. 2, it is to be understood that PNM will support higher quantities of words per burst (e.g., four, eight, etc.). Also, after a burst of n words, a new (random) column address must be presented to the device at the nth CAS occurrence.

Several advantages flow from such PNM operation. First, as shown in FIG. 2, one column access (CAS transition to low logic level) yields a multiple word burst. However, even more significant is the fact that because data is not required on the external DQ lines until after the second CAS occurrence. This allows a significantly longer time interval $t_{AA}$ within which to operate. As a result of the longer time interval $t_{AA}$, pipeline stages can be formed to increase CAS frequency.

On the other hand, SDRAM device technology has also attempted to optimize memory access cycles while working within the confines of uniform clock periods defined by a system clock which provides memory access synchronization. A typical manner in which SDRAM devices operate is as follows. A column address is presented and decoded in the first clock period. Within the next clock period, the decoded address is utilized to bring up (activate) appropriate column select lines and sense the addressed memory locations. In the third clock period, the decoded address is used to actually retrieve the data from the appropriate memory locations and place such data on the DQ lines.

While it requires three clock periods before the SDRAM device outputs data, each period thereafter yields data, thus, providing a continuous data output. Similar to PNM operation in DRAM devices, a longer time interval $t_{AA}$ would be possible which would allow for pipeline operation in order to get continuous (burst) data out after the first memory access propagates through the memory device.

However, in order to achieve the above-described benefits associated with optimizing memory access cycles in cooperation with the latency associated with data (DQ) validation after two or more CAS cycles (referred to hereinafter as CAS latency), it would be necessary to include additional pipestage circuitry, latches and other DRAM and SDRAM specific control logic to the memory device, itself, and/or to the associated controlling circuitry. For example, with respect to SDRAM devices, each pipe stage ideally would have to be of the same duration and, further, independent registers would have to be provided between each stage of the process in order to save the results associated with each stage. It is to be appreciated that such additional circuitry added to either DRAM or SDRAM devices would have the adverse effect of increasing chip size and therefore costs associated with the dynamic memory device.

Therefore, there exists a need in the prior art for methods and apparatus for increasing the data bandwidth of dynamic memory devices which, in particular, exploits the advantages of CAS latency and which may be implemented with little or no additional circuitry.

OBJECTS AND SUMMARY OF THE INVENTION

It is an object of the present invention to provide efficient implementation of PNM operation in state of the art EDO DRAMs. Proposed approaches may also find application in efficient realization of SDRAMs.

It is another object of the present invention to provide methods and apparatus for increasing data bandwidth of a dynamic memory device by utilizing an address transition detection pulse to form a pipeline stage.

It is yet another object of the present invention to provide methods and apparatus for increasing data bandwidth of a dynamic memory device by utilizing existing logic circuitry and signals (e.g., already available latches) to form a pipeline stage.

It is still a further object of the present invention to provide methods and apparatus for increasing data bandwidth of a dynamic memory device by temporarily overlapping pipeline stages to provide a wavepipe operation.

It is still a further object of the present invention to provide methods and apparatus for increasing the data bandwidth of a dynamic memory device, and for decreasing power dissipation by the same, by providing segmented column decoding for least significant bits of a column address.

In accordance with one form of the present invention, a method of substantially increasing the data bandwidth of a dynamic memory device is provided, whereby the dynamic memory device includes at least one storage cell, a column decoder and an internal read/write data bus and whereby the column decoder decodes a column address upon receipt thereof such that data stored in the at least one storage cell corresponding to the decoded column address is placed on the internal read/write data in response to the receipt of an address transition detection (ATD) pulse generated by the dynamic memory device. The method includes the step of temporarily suppressing the generation of the ATD pulse such that data selected from the at least one storage cell is not placed on the internal read/write data bus until after a delayed generation of the ATD pulse. In this manner, a first pipeline stage is advantageously formed which essentially includes the presentation of the column address and decoding thereof. Preferably, the delayed ATD pulse is generated in response to the falling edge of a column address strobe (CAS) signal.

Furthermore, the dynamic memory device further preferably includes output data storage means whereby output data is stored in the output data storage means in response to a transfer pulse and wherein the method of the present invention further includes generating the transfer pulse in substantially close time proximity to the generation of the delayed ATD pulse in order to store data already present on the internal read/write data bus, from previously presented column address, in the output data storage means. In this manner, a second pipeline stage is advantageously formed which includes the generation of the transfer pulse and the storage of the data on the internal read/write data bus in the output data storage means. In one embodiment, the transfer pulse is generated in response to the next falling edge of the CAS signal (i.e., the next falling edge of CAS following the falling edge of CAS which generated the delayed ATD pulse) and, still further, the output data storage means is an off chip driver (OCD) latch. Also, each transfer pulse is preferably delayed with respect to the generation of each delayed ATD pulse in order to realize an overlapping of the first and second pipeline stages, described above, for a period of time. Such overlapping of pipeline stages is referred to as wavepipe behavior.

In another embodiment, the dynamic memory device is a DRAM device initially configured to operate in an extended data output (EDO) mode. Accordingly, by temporarily suppressing the generation of the ATD pulse and by generating the transfer pulse, in the manner explained above, such that the first pipeline stage is defined as decoding the first column address prior to the generation of the delayed ATD pulse and the second pipeline stage is defined as the generation of the transfer pulse and storage of the first pipeline data corresponding to the first column address, it is to be appreciated that pipelined nibble mode operation is substantially realized in the EDO DRAM device.

The present invention also provides for the generation of a single I/O enable signal in the dynamic memory device to commonly enable/disable the off chip drivers (OCDs) whether the memory device is operating in a EDO or PNM mode. Still further, the present invention provides a column decoding technique whereby the column decoder includes segment select line column predecoders located in close proximity to a next decoding stage such that at least two consecutive address bits of the column address are provided to the predecoders. Preferably, due to the frequent toggling of the first two least significant bits of a column address in PNM operation, such first two least significant bits of the column address are provided to the segment select line column predecoders for segmented predecoding. In this manner, due to the fact that the segment select line column predecoders are in close proximity to their corresponding next decoding stage, shorter column predecoded address lines are provided therebetween resulting in lower capacitance on these lines and, therefore, a reduction in power dissipation realized by the dynamic memory device.

Thus, the present invention teaches methods and apparatus for increasing the data bandwidth of dynamic memory devices by forming discrete pipeline stages in existing standard dynamic memory devices by exploiting existing control signals, timing behavior and control circuitry. In this manner, it is to be appreciated that little or no additional control circuitry is required to implement the teachings of the present invention and, as a result, the present invention provides for increased CAS frequency which advantageously yields a substantial increase in the data bandwidth associated with the dynamic memory device.

These and other objects, features and advantages of the present invention will become apparent from the following detailed description of illustrative embodiments thereof, which is to be read in connection with the accompanying drawings.

DETAILED DESCRIPTION OF THE INVENTION

The present invention relates to memory devices with a pipeline that facilitates parallel memory access cycles to increase data bandwidth. As previously described, the pipeline, such as those implemented in conventional PNM DRAMs during CAS latency, require additional latches and substantial control circuitry. However, in accordance with the invention, existing control signals, timing behavior, and control logic are manipulated to form stages of the pipeline. As such, the pipeline is implemented with little or no additional hardware. This results in a significant savings in chip area, thereby decreasing manufacturing cost. Although the invention is described in the context of EDO and PNM DRAMs, it has broader applications. For example, the invention is applicable to other memory architecture utilizing a pipeline to improve or achieve high data bandwidth.

To better understand the invention, a description of the address transition detection (ATD) pulse employed in conventional DRAMs is provided. The ATD pulse is typically generated in response to a column address change in the DRAM device during a memory access, such as a read or write. An illustrative memory read cycle of a conventional EDO DRAM is provided to depict the generation of the ATD pulse.

After initiation of a read access cycle, the row address is placed on the address bus. Upon a RAS transition from, for example, a high to a low logic level, the row address is decoded and the physical memory cells associated with that particular row address (i.e., page) are activated. Activation of the row is achieved by enabling the primary sense amplifiers corresponding to the selected page. Enabling the primary sense amplifiers also refreshes the selected row of memory cells.

A column address is placed on the address line after the row address. The column address is then decoded. The memory cells associated with the decoded column address within the selected page are selected from the primary sense amplifiers and are again amplified by secondary sense amplifiers.

An address transition is when an address is changed on the address bus. Any address transition which occurs after a RAS transition from high to low is a column address transition. Whenever a column address transition is detected, an address transition detection (ATD) pulse is generated. The ATD pulse activates the secondary sense amplifiers which are used to further amplify the signals sensed by the primary sense amplifiers onto the internal read/write data bus. Off chip drivers (OCD) are used to drive the data from the internal read/write data bus onto the DQ lines.

From FIG. 1, it can be seen that the column address transition occurs before a CAS transition from high to low.

As such, the ATD pulse activates the secondary sense amplifiers prior to CAS transition from high to low. Therefore, column address transition accesses the column data and transfers it to the internal read/write data bus. The CAS transition from high to low drives the selected column data onto the external DQ lines.

In accordance with the invention, a pipelined column access path results in shorter CAS cycle times to increase bandwidth. The invention takes advantage of the existing signals to efficiently create a pipeline.

Figure 3:
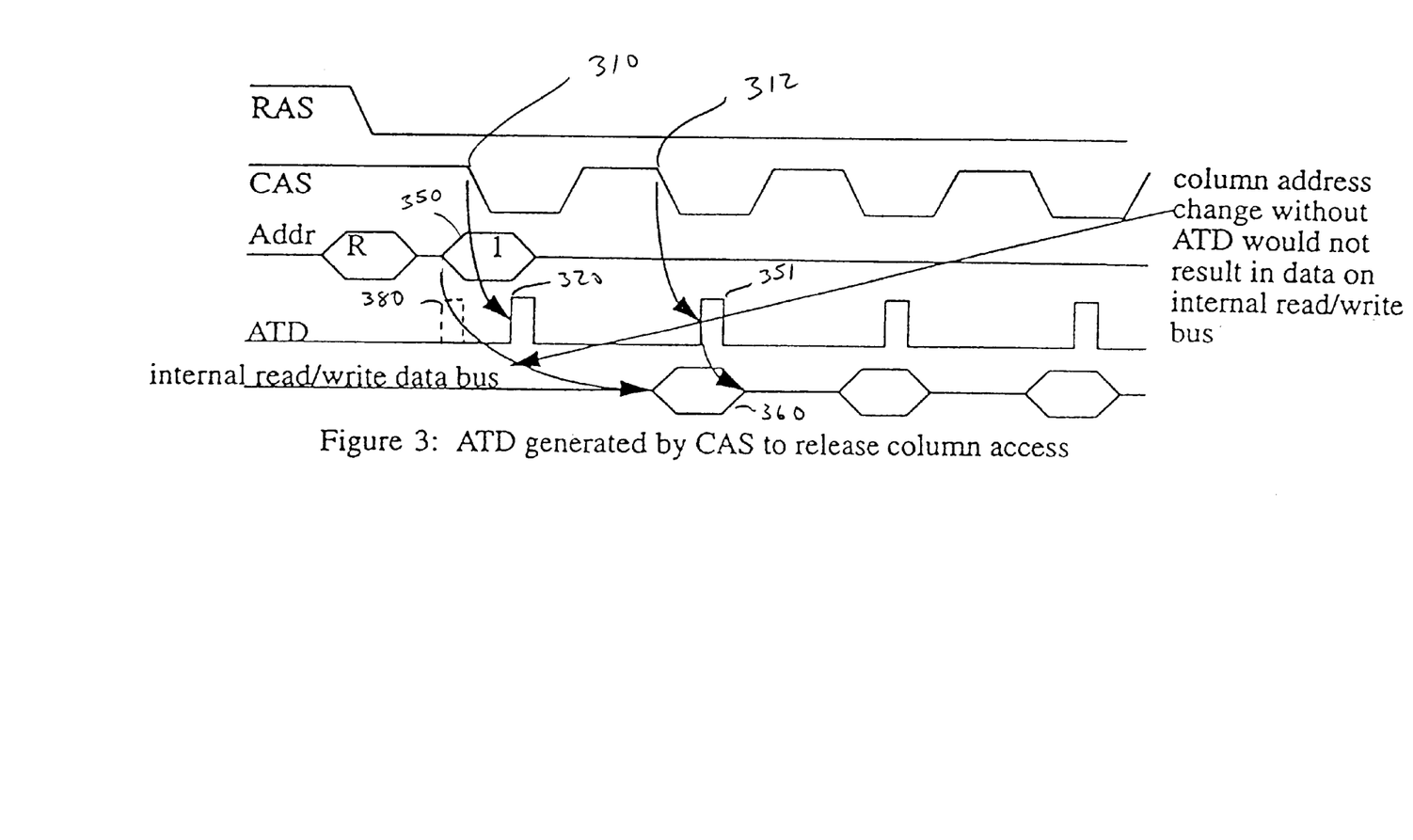
FIG. 3 is a timing diagram illustrating the generation of a ATD pulse at the falling edge of CAS.

In one embodiment, a pipeline stage is established by manipulating the ATD pulse. FIG. 3 shows a timing diagram of the ATD pulse in relation to other signals. As shown, an ATD pulse 320 is generated in response to a CAS transition 310 from an inactive to an active level. Illustratively, the CAS transition is from a logic high to a low logic level (falling edge).

Generating the ATD pulse until after the detection of the falling edge of the CAS delays the generation of the ATD signal over conventional DRAMs (depicted by dotted line 380) by $t_d$. The delay $t_d$ advantageously forms a pipeline stage. The pipeline stage is from the column address transition to the falling edge of CAS which causes the ATD pulse to be generated. As explained earlier, the ATD pulse initiates a column access by accessing a section of the page corresponding to the decoded column address and by activating the secondary sense amplifiers which drives data onto the internal read/write databus. Delaying the generation of the ATD pulse also delays the activation of the secondary sense amplifiers. As a result, the pipeline stage decodes a column address 350 without providing the associated data onto the internal read/write data bus.

In one embodiment, suppressing the generation the ATD pulse until the falling edge of CAS may be implemented by employing simple gating logic. For example, the conventional circuitry used to detect a column address transition 350 and generating the ATD pulse in response thereto can be used to detect the falling edge of CAS 310 instead. By modifying existing circuitry to detect and respond to the falling edge of CAS instead of column address transition, little or no additional circuitry is needed.

Data 360 associated with the decoded column address 350 is not placed onto the internal read/write data bus until after the generation of the ATD pulse 320, which is after the falling edge of CAS. From FIG. 3, data 360 is available on the internal read/write data bus sometime after the ATD pulse. In accordance with PNM, this data is driven onto the DQ lines after the falling edge of CAS 312. However the CAS falling edge 312 also causes another ATD pulse 351 to be generated. The ATD pulse 351 initiates the next column access which precharges all internal buses.

Precharging of the buses destroys all data thereon, including the data 360 on the internal read/write data bus that corresponds to the previous column access. To prevent the data from being destroyed before it is written to the external DQ bus, the data needs to be saved. In conventional EDO DRAMs, the off chip driver (OCD) includes a latch or register for maintaining data from the internal read/write data until the next falling edge of CAS. A transfer signal (TRF) controls data transfer into the OCD latch and for continuous DQ signal driving after precharging of the internal data bus.

In accordance with the invention, a pipeline stage is provided to maintain data from the internal read/write data bus for continuing off chip driving. In one embodiment, the pipeline stage is established by manipulating the TRF signal. This pipeline stage enables data that is associated with the previous memory address to be stored in a latch until it is ready to be placed on the external DQ bus.

Figure 4:
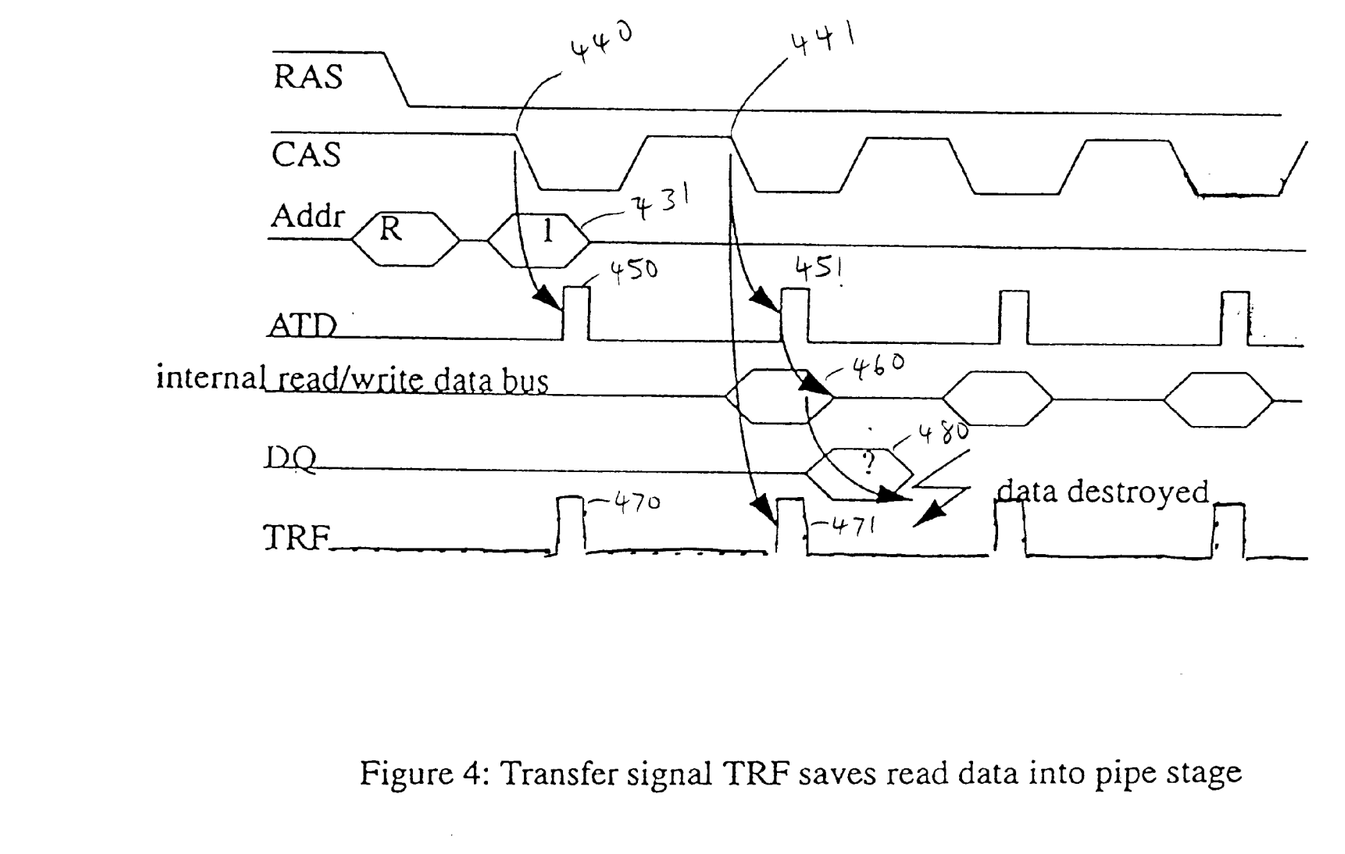
FIG. 4 is a timing diagram illustrating the generation of a transfer pulse at the falling edge of CAS.

FIG. 4 shows a timing diagram of a TRF in relation to other signals. Illustratively, the embodiment includes an ATD signal being triggered by the falling edge of CAS, as described in accordance with FIG. 3. As shown, the TRF pulses are triggered by the falling edge of CAS.

A first ATD pulse 450 is generated in response to a first CAS falling edge 440, causing data 460 associated with the first column address 431 to be placed on the internal read/write data bus. Data 460 appear on the internal read/write bus at about the time when a second CAS falling edge 441 occurs. The second falling edge of CAS triggers ATD and TRF pulses 451 and 471, respectively. The ATD pulse 451 initiates a column access for the next column address. At about the same time, the TRF pulse causes the data 460 to be transferred to the OCD latch, preventing its destruction as the internal read/write bus is precharged because of the ATD pulse. Data 460 is subsequently driven onto the DQ lines.

As described, the pipeline stage is between the TRF pulse 471 and the previous ATD pulse 451. The pipeline stage, which stores data 460 from the previous column address into the OCD latch, prevents data 460 from being destroyed before and after being driven onto the DQ lines. Such operation which provides selected data on the DQ lines after the second falling edge of CAS is in accordance with the PNM.

In accordance with the invention, triggering the TRF pulse on the edge of CAS can be implemented by employing simple gating logic. For example, the conventional circuitry used to detect trigger the TRF pulse can be modified to trigger it on the falling edge of CAS. By modifying existing EDO circuitry to trigger the TRF pulse at the falling edge of CAS, little or no additional circuitry is needed.

As discussed previously, PNM dictates that contiguous blocks of data are accessed in a burst. Conventional PNM DRAMs employ the use of a counter or counters to increment a column address strobed in by CAS in order to select data blocks in contiguous physical memory locations, i.e., to burst multiple contiguous data words without presenting further external column addresses to the DRAM during the data burst. To effectively provide the burst function of PNM, a counter is used to increment the address of the first column address such that sequential column addresses are processed by the DRAM to complete the burst.

Figure 5:
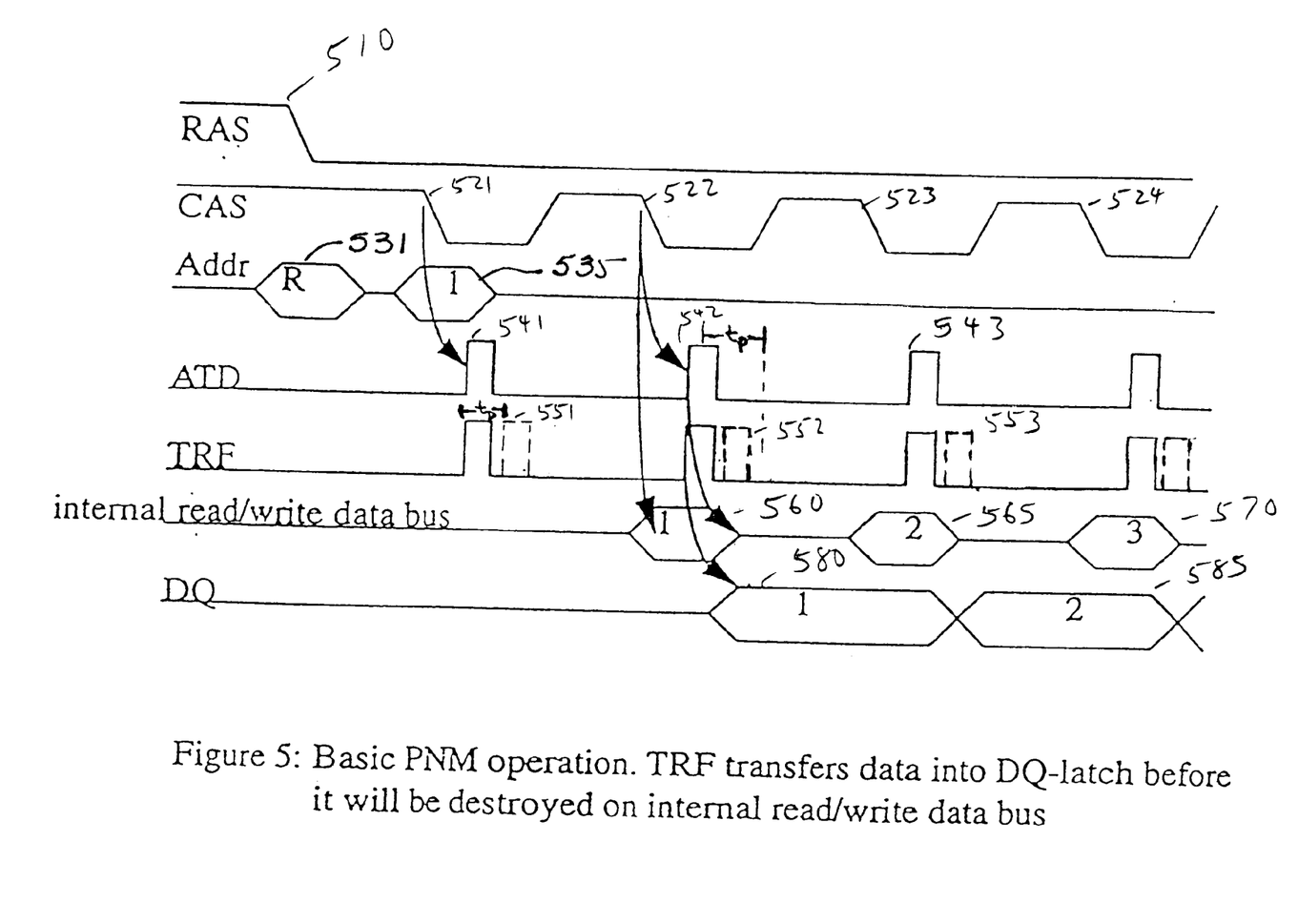
FIG. 5 is a timing diagram illustrating the timing behavior resulting from the generation of the ATD pulse and the transfer pulse in accordance with the present invention.

In another embodiment, pipeline stages in accordance with FIG. 3 and FIG. 4 are combined to effectively replicate PNM functions. FIG. 5 shows the timing diagram of the ATD and TRF signals in relation to other signals during a memory access. As shown, both ATD and TRF pulses are triggered by the falling edge of CAS to create the pipeline stages. The memory access commences with a RAS falling edge 510, causing a row address 531 to be decoded. The decoded row address activates a row of memory cells with which they are associated. A first stage of the pipeline then decodes a column address 535. An ATD pulse 541, which is triggered by a first CAS falling edge 521, starts the second stage of the pipeline. In the second pipeline stage, data 560 associated with the column address 535 is read and driven onto the internal read/write data bus. As shown, the data appears on the internal read/write data bus at about the time that a next CAS falling edge 522 occurs. CAS falling edge 522 generates TRF pulse 552, initiating the third stage of the pipeline. The third stage: of the pipeline stores data 560 in, for example, an OCD latch.

A counter, for example, increments to provide the column address for the second column access, causing the first pipeline stage to be restarted. Additionally, the CAS falling edge 522 triggers ATD pulse 542, initiating a second column access of the burst. The data buses are precharged as a result of the second column access, destroying all data thereon. However the TRF pulse 552 stores the data 560 before being destroyed as a result of the second column access. The data stored in the OCD latch is then driven onto the external DQ bus. Thus, data 580 on the DQ bus corresponds to the column address 535. Data 580 is validated sometime after the second CAS falling edge but before the third CAS falling edge, which is consistent with PNM. Subsequent counter increments and ATD and TRF pulses restart the first, second, and third pipeline stages until the PNM burst is completed.

Typically, there exist a delay (e.g., approximately 1 to 2 nanoseconds) between the time when an ATD pulse is generated to cause a column access and when the previous data on the internal read/write data bus is actually destroyed. This is because it requires some time to precharge the data bus to a sufficient level to overwrite the data thereon. This delay is referred as the $t_{DD}$ (data destroyed. Such delay can be advantageously used to activate the second pipeline stage for the next data access while the previous access is still active. This fact can be exploited to enable a DRAM to operate with shorter CAS cycle time, resulting in faster operating speed and increased data bandwidth.

In another embodiment of the invention, the delay $t_{DD}$ is advantageously employed to improve CAS cycle time. In particular, the TRF pulse is generated in response to a CAS transition from a high to a low plus a delay $t_p$, as shown in FIG. 5. This results in the generation of the TRF pulse delayed by $t_p$ with respect to the ATD pulse. The delay $t_p$ is less than about $t_{DD}$. In yet another embodiment, the delay $t_p$ is < about 95% of $t_{DD}$, preferably, the delay $t_p$ is < about 90% of $t_{DD}$. More preferably, $t_p$ is between about 20–90% of $t_{DD}$, even more preferably, $t_p$ is between about 50–85% of $t_{DD}$, and most preferably, $t_p$ is between about 70–80% of $t_{DD}$. Delaying the generation of TRF causes overlapped operation of the second pipeline stage by $t_p$. As shown in FIG. 5, ATD pulse 542 releases the second column access before TRF pulse 552 is generated to terminate the first column access. As such, both the first column and second column access are simultaneously active, at least until TRF pulse 552 is triggered. A pipeline with two of the same pipeline stages overlapping (i.e., active at the same time) is referred to as a wavepipe. Such approach advantageously allows further reduction of CAS cycle time (i.e. increasing CAS frequency) without additional timing and complexity penalties associated with additional control circuitry.

In PNM or burst EDO mode operation as well as in other high performance memories such as SDRAMs, SLDRAMs, or Rambus devices, the two least significant bits of the column address, ADD<0> and ADD<1>, toggle frequently. This is due to the fact that after an initial column address is received, the subsequent column addresses are generated via a counter or counters to incrementally increase the column address. In this way, consecutive physical memory locations are selected and, thus, contiguously stored data is accessed in order to generate the desired data burst. However, if the capacitance on the signal lines associated with the toggling bits are substantially high, considerable power dissipation results.

Figure 6A:
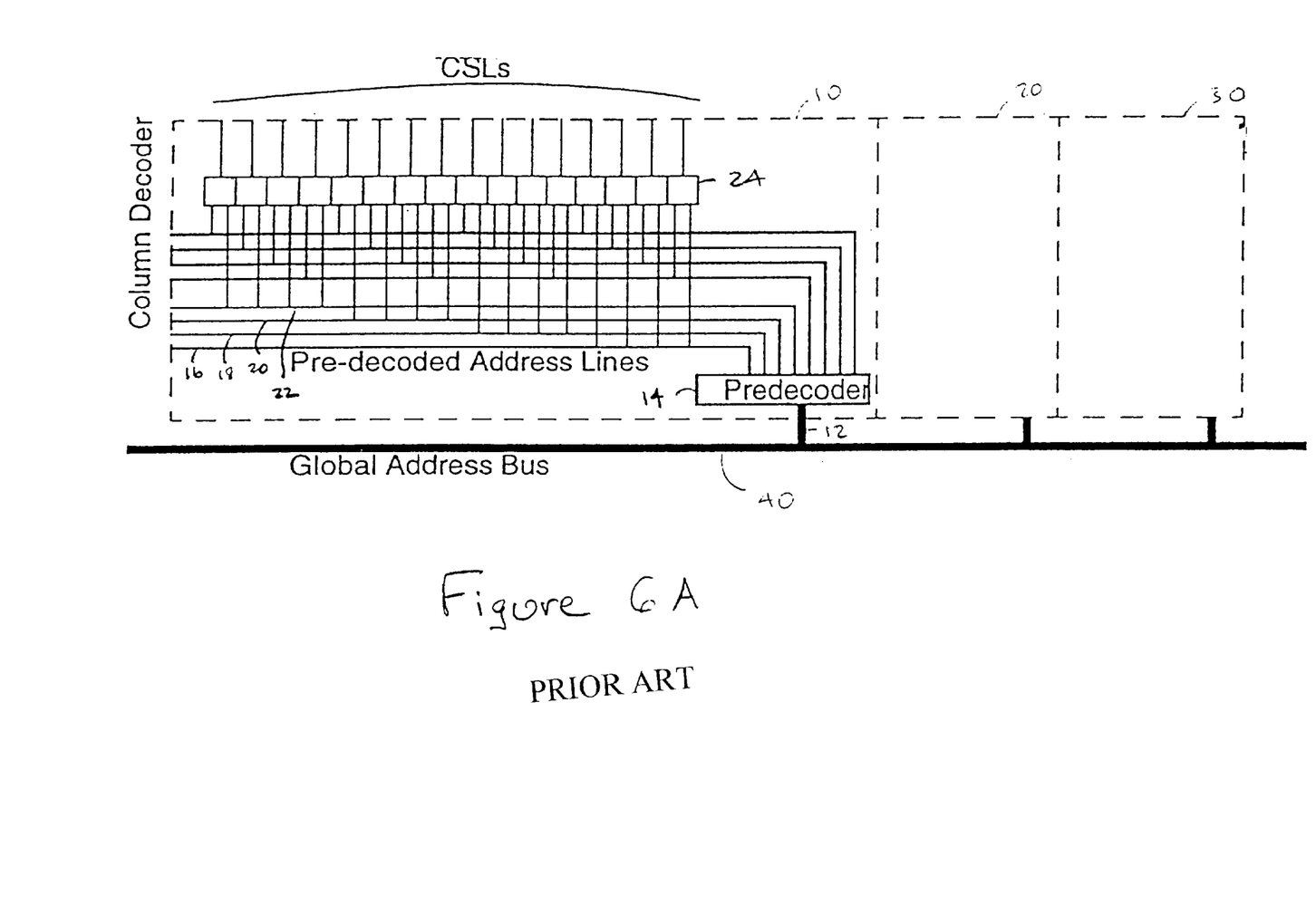
FIG. 6A is a simplified block diagram of a conventional column decoder.

Referring to FIG. 6A, a conventional column decoder 10 is shown. The column decoder 10 is operationally coupled to a global address bus 40. Illustratively, the column address decoder 10 is a four bit decoder and, thus, column decoders 20, 30, etc., are used to fully decode an entire column address. Nonetheless, the lower four bits of a column address are typically provided to a predecoder 14 within the column decoder 10. Predecoder 14 separates the lower four bits into eight signal lines (4 signals for each 2 bit group). The two least significant bits (ADD<0>, ADD<1>) are separated into predecoded address lines 16 through 22. These address lines, which are provided to the decoders 24 of the next decoding stage for further decoding, substantially extend the length of the column decoder region. These predecoded address lines inside the conventional decoder are relatively long and therefore have high capacitance. Frequent toggling of high capacitance lines needlessly wastes power.

Figure 6B:
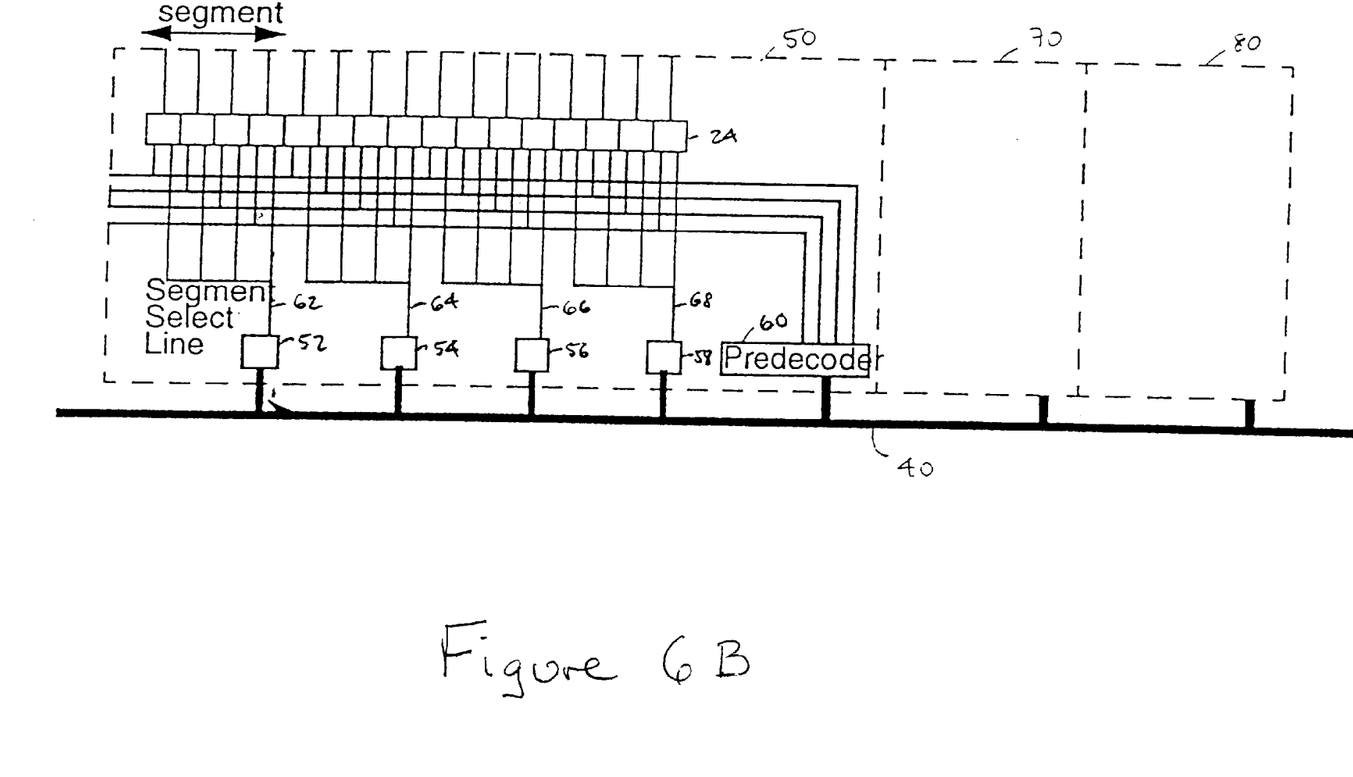
FIG. 6B is a block diagram of a segmented select line column decoder that provides a segmented decoding in accordance with the present invention.

FIG. 6B shows a decoder 50 with segmented predecoder in accordance with the present invention. As shown, segment select line predecoders 52–58 of decoder 50 are operatively connected to the global address bus 40. Each segment select line predecoder 52–58 is provided with the two least significant bits of the column address. It should be appreciated that any number of bits associated with the column address could be segmented in this manner in order to reduce power dissipation; however, at a minimum, the present invention provides that the two least significant bits are predecoded in this manner. This is desirable, because in PNM, such first two least significant address bits will toggle most frequently. It is to be appreciated that the major difference in the column decoder 50 of the present invention as compared to the conventional decoder 10, shown in FIG. 6A is that the predecoded column address lines 62–68 corresponding to the least significant address bits, ADD<0> and ADD<1>, do not substantially extend the length of the decoder 50. Rather, the segment select line predecoders have to drive predecoded address information only within their segment, therefore, the predecoded address lines are significantly shorter. Shorter lines reduce capacitive loading, which lowers power dissipation.

Figure 6C:
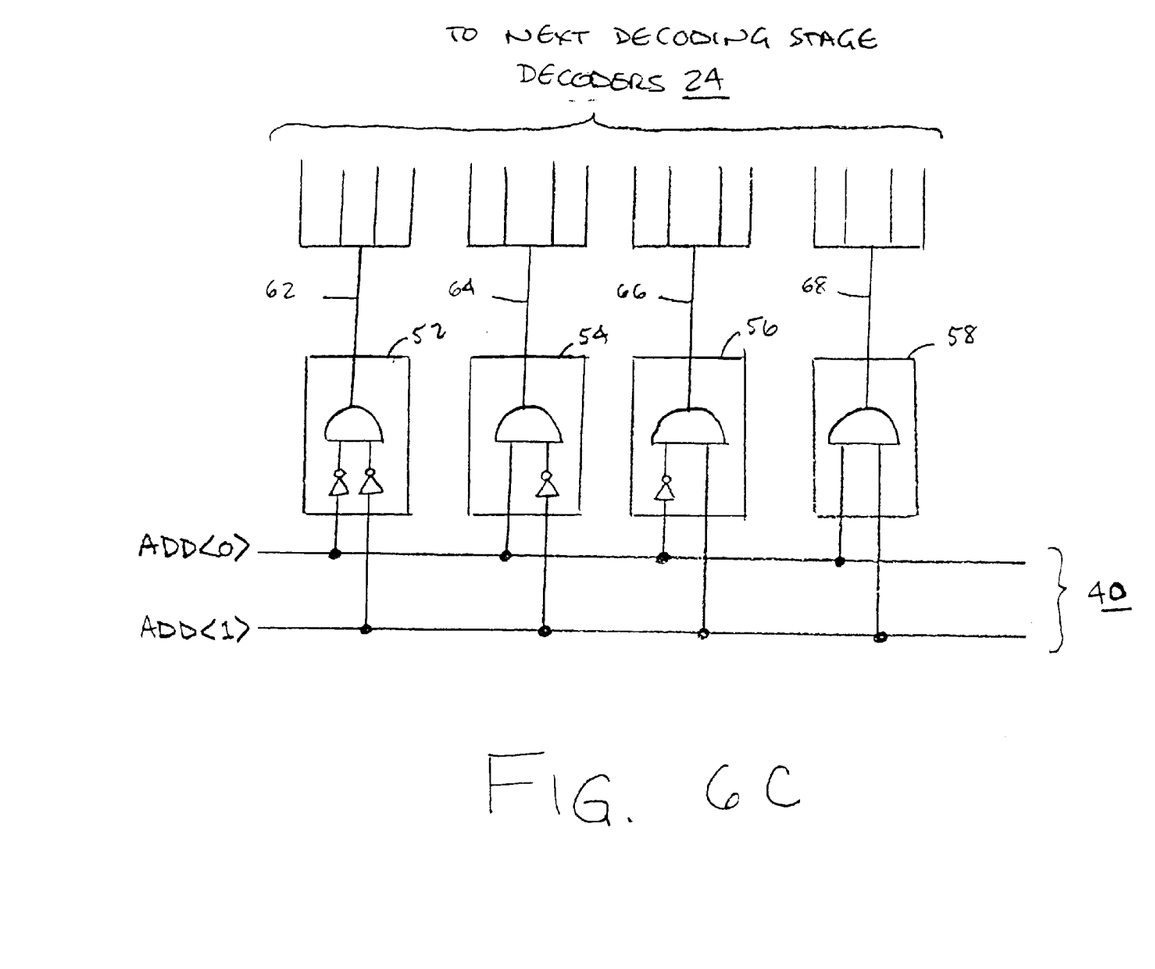
FIG. 6C is a partial schematic diagram of an exemplary segmented select line column decoder in accordance with the present invention.

FIG. 6C shows predecoders of the segmented decoder in greater detail. Illustratively, predecoders 52–58 are internally configured to predecode the two least significant column address bits, ADD<0> and ADD<1>, in the following manner. Predecoder 52 is responsive to the address occurrence of ADD<0>=0, ADD<1>=0. In such a situation, in accordance with the logically configured predecoder 52 shown in FIG. 6C, predecoded column address line 62 becomes active (high logic level) and, thus, activates four of the decoders of decoders 24 (i.e., segment) of the next (e.g., final) decoding stage. Predecoder 54 is responsive to the address occurrence ADD<0>=1, ADD<1>=0, which serves to activate the segment associated with predecoded column address line 64. Predecoders 56 and 58 are respectively responsive to the address occurrences ADD<0>=0, ADD<1>=1 and ADD<0>=1, ADD<1>=1, which respectively activate the segments respectively associated with predecoded column address lines 66 and 68. Then, one of the four decoders of decoders 24 of a particular segment in the next decoding stage is selected by the non-segmented predecoder 60, which is not toggled at all during a burst within ADD<0> and ADD<1>. Thus, as explained above, predecoders 52–58 need only drive predecoded address information within its own segment, thus, shortening the predecoded address lines, reducing capacitance and, correspondingly, reducing power dissipation of the memory chip.

Although the illustrative embodiments of the present invention have been described herein with reference to the accompanying drawings, it is to be understood that the invention is not limited to those precise embodiments, and that various other changes and modifications may be affected therein by one skilled in the art without departing from the scope of the invention.

What is claimed is:

1. A method of substantially increasing the data bandwidth of a dynamic memory device, the dynamic memory device including at least one storage cell, a column decoder and an internal read/write data bus, the column decoder decoding a column address upon receipt thereof such that data stored in the at least one storage cell corresponding to the decoded column address is placed on the internal read/write data bus in response to receipt of an address transition detection (ATD) pulse generated by the dynamic memory device, the method comprising the step of temporarily suppressing the generation of the ATD pulse such that data selected from the at least one storage cell is not placed on the internal read/write bus until after a delayed generation of the ATD pulse, such that a first pipeline stage is thereby substantially defined; and further comprising the step of generating the delayed ATD pulse in response to a column address strobe (CAS) signal.

2. The method as defined in claim 1, wherein the dynamic memory device further includes output data storage means and wherein output data is stored in the output data storage means in response to a transfer pulse, wherein the method further comprises generating the transfer pulse in substantially close time proximity to the generation of the delayed ATD pulse in order to store data present on the internal read/write data bus in the output data storage means, such that a second pipeline stage is thereby substantially defined.

3. The method as defined in claim 2, further comprising the step of generating the transfer pulse in response to a column address strobe (CAS) signal.

4. The method as defined in claim 2, wherein the generation of each transfer pulse is delayed with respect to the generation of each delayed ATD pulse in order to realize an overlapping activation of the same pipeline stage.

5. The method as defined in claim 2, wherein the output data storage means is an off chip driver latch.

6. The method as defined in claim 1, wherein the dynamic memory device is a dynamic random access memory (DRAM) device.

7. The method as defined in claim 1, wherein the dynamic memory device is a synchronous dynamic random access memory (SDRAM) device.

8. A method of substantially increasing the data bandwidth of a dynamic random access memory (DRAM) device initially configured to operate in an extended data output (EDO) mode, the EDO DRAM device including at least one storage cell, a column decoder, an internal read/write data bus and an off chip driver latch, the column decoder decoding a column address upon receipt thereof such that data stored in the at least one storage cell corresponding to the decoded column address is placed on the internal read/write data bus in response to the receipt of an address transition detection (ATD) pulse generated by the dynamic memory device and further wherein output data is stored in the off chip driver latch in response to a transfer pulse, the method comprising the steps of:

a) temporarily suppressing the generation of the ATD pulse such that data selected from the at least one storage cell is not placed on the internal read/write data bus until after a delayed generation of the ATD pulse in response to the falling edge of a column address strobe (CAS) signal, such that a first pipeline stage is thereby substantially defined; and b) generating the transfer pulse in response to the same falling edge of the CAS signal in order to store data present on the internal read/write data bus in the off chip driver latch, such that a second pipeline stage is thereby substantially defined;

whereby pipelined nibble mode operation is substantially realized by the EDO DRAM device.

9. The method as defined in claim 8, wherein the generation of each transfer pulse is delayed with respect to the generation of each delayed ATD pulse in order to realize an overlap of the same pipeline stage.

10. The method as defined in claim 8, wherein the column decoder includes segment select line column predecoders located in close proximity to corresponding final decoding stages such that at least two consecutive address bits of the column address are provided thereto.

11. The method as defined in claim 8, wherein the at least two consecutive column address bits are the two least significant bits of the column address.

* * * * *